United States Patent [19]
Ishaque et al.

[11] Patent Number: 5,288,989
[45] Date of Patent: Feb. 22, 1994

[54] AVALANCHE PHOTODIODE WITH MOISTURE RESISTANT PASSIVATION COATING DISPOSED TO COVER THE OUTER PERIPHERY OF THE PHOTODIODE BODY EXCEPT AT A SELECTED TOP CONTACT AREA

[75] Inventors: A. Nadeem Ishaque, Clifton Park; Robert F. Kwasnick, Schenectady, both of N.Y.

[73] Assignee: General Electric Company, Schenectady, N.Y.

[21] Appl. No.: 42,177

[22] Filed: Apr. 2, 1993

[51] Int. Cl.$^5$ .............................................. H01J 40/14
[52] U.S. Cl. .............................. 250/214.1; 250/208.1; 257/186
[58] Field of Search ............. 250/214.1, 208.1, 214 R, 250/578.1; 257/186, 291, 435, 438

[56] References Cited

U.S. PATENT DOCUMENTS

| | | |
|---|---|---|
| 4,780,394 | 10/1988 | Blanchard et al. .................. 257/291 |
| 5,233,181 | 8/1993 | Kwansnick et al. . |
| 5,243,177 | 9/1993 | Fujimagari et al. ............. 250/208.1 |

OTHER PUBLICATIONS

Technical proposal entitled, "Solid-State Avalanche Photodiode Detector Array Technology for Medical, Environmental, and Research Applications," submitted to National Institute of Standards & Technology as confidential, proprietary information, dated Feb. 23, 1993, pp. 5–13 5–16.
"Benzocyclobutene (BCB) Dielectrics for the Fabrication of High Density, Thin Film Multichip Modules," David Burdeaux et al., AIME, Jun. 22, 1990, revised Aug. 15, 1990, pp. 1357–1367.

*Primary Examiner*—David C. Nelms
*Assistant Examiner*—Que T. Le
*Attorney, Agent, or Firm*—Donald S. Ingraham; Marvin Snyder

[57] ABSTRACT

An avalanche photodiode (APD) has a two tier passivation layer disposed over the silicon APD body. The passivation layer includes an inorganic moisture barrier layer and an organic dielectric layer. The inorganic material forming this layer is preferably silicon nitride or silicon oxide, and the organic dielectric material is a polyimide or benzocyclobutene.

12 Claims, 1 Drawing Sheet

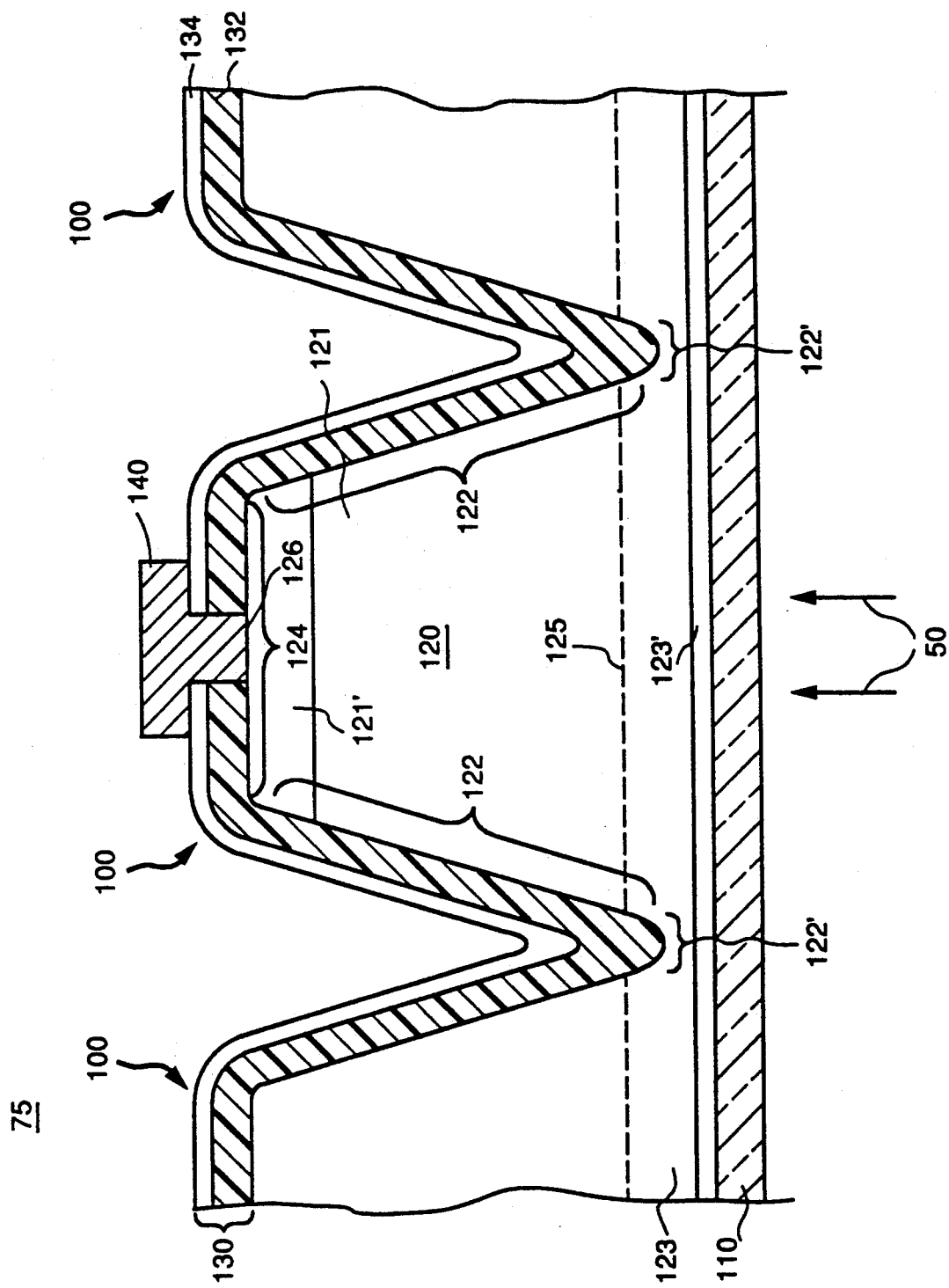

AVALANCHE PHOTODIODE WITH MOISTURE RESISTANT PASSIVATION COATING DISPOSED TO COVER THE OUTER PERIPHERY OF THE PHOTODIODE BODY EXCEPT AT A SELECTED TOP CONTACT AREA

FIELD OF THE INVENTION

This invention relates generally to avalanche photodiodes and more particularly to moisture-resistant passivation layers adapted for use on arrays of avalanche photodiodes.

BACKGROUND OF THE INVENTION

Avalanche photodiodes (APDs) detect incident optical photons and amplify the resultant charge generated, typically by an order of magnitude or more. See, for example, B. Saleh and M. Teich, *Fundamentals of Photonics* (1991), pp 666–673, which is incorporated herein by reference. APDs have use in nuclear imaging applications, for example, gamma cameras and other devices in which the nature of the radiation imaged is such that not many optical photons are generated by the interaction of the incident radiation and the scintillator material. Crystalline silicon (Si) is commonly used in the fabrication of APDs due to the advantageous photoelectric characteristics of silicon and the relative ease of fabrication.

APDs typically include an island or body of layers of appropriately doped crystalline silicon disposed between two electrodes electrically coupled to opposite surfaces of the APD body. Relatively high voltages (e.g., about 1000 V to 1500 V) are applied across the APD to generate the electric field necessary to cause the avalanche effect. As incident radiation is absorbed in the silicon, holes and electrons are produced and accelerate toward the upper or lower surface of the photodiode dependent on the electric field established by the electrodes, and as they accelerate they displace more holes and electrons, causing the amplification of the signal. The amount of charge collected at the electrodes is a function of the energy flux of the incident light and the amplification of the APD. Periodic measuring of charge collected on a photodiode, and resetting the diode to a known charge condition, is used to process electrical signals generated by the photodiode in response to incident radiation.

Noise in an array of APDs is critical because of the high electric fields and the consequent amplification of any noise-inducing factor. Noise arises from bulk leakage current, device capacitance, and charge injection into the high (electric) field region of the device from the surface of the APD. Because surface conditions are difficult to control in semiconductor processing, the APD must be structured so as to reduce the peak surface electric field well below the peak bulk electric field for stable device operation. This structuring is accomplished by beveling the periphery of a discrete device, or, alternatively, the mechanical grooves that provide isolation of individual APDs in a monolithic array of the devices. The beveling process results in a structure in which the doped material on one side of the p-n junction has been preferentially removed, leaving a beveled edge that slopes away from the vicinity of the p-n junction. Subsequent to beveling, the silicon surface must be treated with a suitable passivant to prevent charge injection from the surface and to limit the surface leakage current, thereby permitting low noise operation.

It is desirable that the passivating layer have the following characteristics: First, it should act as an electrically insulating barrier between the upper electrode, the APD body, and other underlying electrically conductive components that are used in reading and processing electrical signals generated by the photodiode. Second, the passivating layer should be capable of being selectively etched with respect to the silicon body of the APD to enable formation of a non-leaky contact connection between the upper electrode and the upper surface of the photodiode body. Third, the passivating layer should cover the photodiode body without cracking or inducing stresses that adversely effect photodiode performance or the dielectric integrity of the passivating layer. Fourth, the interface between the passivating layer and the beveled edge of the photodiode body should have minimal conductivity so that photodiode leakage in reverse bias is not degraded by the presence of the dielectric. Fifth, the passivating layer should be thick enough (on the order of about 5 microns) so that the electric field inside the dielectric does not become very large (e.g., less than about $2 \times 10^6$ V/cm). Additionally, the passivating layer should desirably protect the APD beveled surfaces from degradation due to humidity, moisture, or chemical attack from materials in the environment or present on the wafer. This latter concern is present both during fabrication and also over time as the device is exposed to a variety of environments.

Passivating layers are commonly made up of one layer of material. Certain polyimides, particularly preimidized polyimides, have been found to provide a satisfactory passivating layer with regard to several of the desirable characteristics listed above. Drawbacks to polyimide passivating layers include the poor moisture barrier provided by polyimides. Indeed, most polyimides providing otherwise satisfactory passivating layer characteristics are hygroscopic, that is they tend to absorb moisture from the environment. This characteristic is particularly undesirable in light of the increased leakage resulting from degradation of the APD beveled surface in contact with polyimide. One manner of providing moisture protection has been to hermetically seal the entire chip containing the array of photosensors, a process that leads to bulkier arrays and increased steps in fabrication of the arrays.

Single layer inorganic dielectrics have been used in some situations, but typically such layers cannot be deposited to the required thickness to provide the desired passivating characteristics without experiencing debilitating stresses that affect the structural integrity of the dielectric layer and degrade device performance and longevity.

A two-layer dielectric structure is disclosed by R. Kwasnick and J. Kingsley in the application entitled "Photosensitive Element with Two Layer Passivation Coating", Ser. No. 07/891,117, filed Jun. 1, 1992 and allowed Feb. 3, 1993, now U.S. Pat. No. 5,233,181, which is assigned to the assignee of the present invention and incorporated herein by reference. The two-layer passivation structure comprises an organic dielectric layer and an inorganic moisture barrier layer. In devices comprising amorphous silicon, however, the inorganic dielectric layer is advantageously disposed adjacent to the amorphous silicon and the polyimide dielectric disposed over the inorganic layer in order to prevent moisture leaching from the polyimide into the amorphous silicon. Further, in devices in which amorphous silicon comprises the photosensitive semiconductive material, constraints of temperature in the formation process relative to the optimal cure temperature for the polyimide make it undersirable to place the polyimide immediately adjacent to the photosensitive material. Specifically, the maximum temperature to which the amorphous silicon structure can be exposed in the fabrication process without damaging the semiconductor material is about 250° C., thus limiting the cure temperature of the polyimide and preventing all moisture from being driven out of the polyimide. Thus the moisture inherent in the polyimide itself contaminates the amorphous silicon structure.

It is thus an object of this invention to provide an APD having a passivating layer that provides a high integrity moisture barrier.

It is a further object of this invention to provide a passivating layer for an APD that provides a high integrity dielectric layer that is structurally sound.

Another object of this invention is to provide a low noise APD.

SUMMARY OF THE INVENTION

In accordance with the present invention, an avalanche photodiode (APD) includes an APD body, a bottom contact pad, a top contact, and a two-tier passivation layer. The APD body comprises a photosensitive semiconductive material, a portion of the semiconductive material forming a first layer that is doped to exhibit n-type conductivity and a portion of the semiconductive material forming second layer that is doped to exhibit p-type conductivity, the first and second layers adjoining one another to form a p-n junction. The APD body further has an outer periphery that comprises beveled sidewalls that terminate in arcuate-shaped portion in the vicinity of the p-n junction. The bottom contact pad is disposed in electrical contact with one of the semiconductive layers and the top contact is disposed in electrical contact with the other of the semiconductive layers. The two-tier passivation layer is disposed over the APD body so as to cover the outer periphery of the APD body except at a selected contact area with the top contact. An APD in accordance with this invention is readily fabricated in an array of similarly-structured APDs, with mechanical grooves separating the individual devices. In such an arrangement, the passivation layer is disposed over the grooved areas on the array, the beveled surfaces of each APD, and portions of the top periphery surface of each APD except at the selected top contact area. The passivation layer includes an inorganic moisture barrier layer and an organic dielectric layer.

The inorganic moisture barrier layer typically comprises silicon nitride. The organic dielectric layer typically comprises a polyimide or a benzocyclobutene, with the organic dielectric layer typically being disposed in contact with the photosensitive semiconductive material comprising the APD body. The thickness of the inorganic moisture barrier layer is preferably between about 400 Å and 1 micron, and the thickness of the organic dielectric layer is preferably between about 2 and 10 microns.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

The single FIGURE is a cross-sectional view of an avalanche photodiode in accordance with this invention.

DETAILED DESCRIPTION OF THE INVENTION

As illustrated in the FIGURE, an avalanche photodiode (APD) 100 in accordance with this invention comprises a bottom contact pad 110, an APD body 120, a two-tier passivating layer 130, and a top contact 140. APD 100 is typically positioned to be exposed to incident optical radiation 50. In a common arrangement, APD 100 is one of a number of APDs in an array 75.

Bottom contact pad 110 typically comprises an optically transparent conductor such as indium tin oxide or the like and has a thickness of between about 100Å and 1000Å. Bottom contact pad 110 is disposed in electrical contact with the material of APD body 120 and comprises one of the conductors disposed to apply a selected relatively high voltage (typically between about 1000 volts and 1500 volts) across APD body 120 to produce the electric field that causes the device to operate in the avalanche mode.

APD body 120 is disposed so as to be in electrical contact with bottom contact pad 110. For ease of description, "lower" and "bottom" are used interchangeably and "upper" and "top" are used interchangeably to refer to portions of the APD with respect to the device as illustrated in the Figure; no operational or functional limitation on the orientation of the device is implied. APD body 120 is typically mesa-shaped, having beveled sidewalls 122 sloping upwardly and inwardly from bottom contact pad 110 towards an upper surface 124 that is relatively flat.

APD body 120 advantageously comprises a photosensitive semiconductive material such as neutron transmutation doped crystalline silicon (typically having less than 0.5% resistivity variation across a wafer) (referred to herein as silicon). APD body 120 typically comprises a p doped region 123 in which the semiconductive photosensitive material has been doped to exhibit p type conductivity 123, and a p+ doped region 123', which is disposed in contact with bottom contact pad 110. The remaining portion of APD body comprises the n-type neutron transmutation doped silicon disposed in n type region 121, and an n+ doped region 121' disposed in the portion of APD body 120 at which electrical contact with is made with top contact 140. The p doped and n doped regions form a p-n junction 125 (indicated in the Figure by the dotted line) where the respective regions adjoin one another. Beveled sidewalls 122 terminate in an arcuate-shaped portion 122' in the vicinity of the p-n junction; the beveled sidewalls are disposed such that n-type region 121 becomes progressively narrower extending upward from p-n junction 125. The thickness of n type region 121 is typically between about 100 microns and 200 microns and the thickness of p doped region 123 is typically between about 20 microns and 100 microns. The overall thickness of APD body is typically between about 200 microns and 350 microns.

In accordance with this invention, passivation layer 130 comprises an organic dielectric layer 132 and an inorganic moisture barrier layer 134. As illustrated in the Figure, organic dielectric layer 132 is disposed over the upper surface of APD body 120; when multiple APDs are arranged in array 50, organic dielectric layer 132 is disposed over substantially the entire array, except for respective top contacts 140 at each APD. It is desirable that the top surfaces of organic dielectric layer 132 be reasonably smooth so that moisture barrier layer 134 deposited thereover will be of high integrity. Organic dielectric layer 132 also advantageously has some planarizing effect, limiting step coverage problems for the overlying moisture barrier layer 134.

Organic dielectric layer 132 typically comprises a polyimide (and preferably a preimidized polyimide, such as the Ciba-Geigy ® 200 series), or, alternatively, a benzocyclobutene. Information regarding the benzocyclobutene class of organic dielectrics is contained in the article "Benzocyclobutene (BCB) Dielectrics for the Fabrication of High Density, Thin Film Multichip Modules", by D. Burdeaux, P. Townsend, and J. Carr in *Journal of Electronic Materials*, vol. 19, no. 12, (1990) pp 1357–66, which is incorporated herein by reference. The organic dielectric is deposited, for example by spin coating, to a thickness of between about 2 microns and about 10 microns; the thickness is selected to provide the desirable passivation layer characteristics (except for the moisture resistance) noted above. After application, the inorganic material is cured at a temperature, e.g., up to 400° C., that drives out substantially all moisture inherently in the material during the application process. The crystalline silicon comprising APD body 120 is able to withstand the high cure temperature without adversely affecting the performance of the completed device. Photosensors that comprise amorphous silicon are much more sensitive to the heat, and as a consequence the cure temperature must be kept at a relatively low temperature level that precludes all residual moisture in the material from being driven out during the curing process. As a consequence, in amorphous silicon based photosensors, the organic dielectric layer cannot advantageously be disposed adjacent to the photosensitive semiconductive material comprising the photosensitive body because the residual moisture leaches into the photosensitive material and causes degradation of photosensor performance.

Moisture barrier layer 134 comprises an inorganic dielectric material, such as silicon nitride. The structure of moisture barrier layer 134 is selected to adhere well to organic dielectric layer 132 and have high structural integrity. The thickness of moisture barrier layer is typically between about 400 Å and 1 micron. The moisture barrier layer is typically formed by the deposition of the inorganic dielectric material, for example by PECVD, in a deposition process that generally does not require temperatures in excess of about 400° C. Further, as the inorganic dielectric material layer is relatively thin, it is not prone to crack or experience significant stress such that its structural integrity is degraded.

The inorganic dielectric material bonds well to the organic dielectric layer disposed over the APD body and forms a barrier that is highly resistant to penetration by moisture. This protection is of particular importance over beveled sidewalls 122, which otherwise present relatively large surfaces that are subject to degradation from exposure to moisture over time and can become the source of considerable degradation of the device.

Top contact layer 140 is disposed over a portion of passivation layer 130 and is in electrical contact with APD body 120 at selected contact area 126. Selected contact area 126 is formed, for example, by chemical or laser etching, to open a via opening in passivation layer 130 through which a portion of top contact 140 extends to be in electrical contact with APD body 120. Top contact 140 comprises a conductor such as gold, silver, or the like, and forms the electrical contact between the APD and other elements used in reading and processing of charge generated by the photodiode in response to incident radiation. This electrically conductive material is deposited, for example by sputtering, and patterned to form the desired contacts. Bottom contact pad 110 and top contact 140 serve as the electrodes in the APD to establish the electric field across the device to allow the charge to be collected. Top contact 140 generally has a thickness between about 0.1 micron and 1 micron.

As illustrated in the Figure, organic dielectric layer 132 is typically disposed over the upper surface of APD body 120 and extends up to and is immediately adjacent to the metal of top contact 140, with inorganic dielectric layer 134 disposed only over the upper surface of organic dielectric layer 132. Alternatively, inorganic dielectric layer 134 can be disposed completely over organic dielectric layer to seal it from top contact 140. In this arrangement (not shown), inorganic dielectric layer 134 is disposed between organic dielectric layer 132 and top contact 140 so that there is no direct interface between organic dielectric layer 132 and the metal of top contact 140.

In an alternative embodiment, in an APD array otherwise similar to the APD array described above, moisture barrier layer 134 is disposed adjacent to the photosensitive semiconductive material comprising APD body 120, and the organic dielectric layer is disposed over the moisture barrier layer. In this arrangement, inorganic dielectric layer comprises silicon nitride that is preferably silicon-rich, that is having a greater ratio of silicon to nitride than stoichiometric silicon nitride, for example $SiN_x$, in which x is less than 1.33. Tests conducted on arrays fabricated in accordance with the two embodiments described above indicate the array constructed with organic dielectric layer adjacent to APD body exhibits lower noise. For example, in otherwise similar nine-element arrays, measured leakage current was 10 nA for the arrangement in which the organic dielectric 132 was disposed immediately adjacent to APD body 120, and 30 nA in the embodiment in which the inorganic dielectric was disposed immediately adjacent to APD body 122. This improved array performance, that is lower noise, arises from the low leakage of APDs fabricated in accordance with this invention. Factors that are thought to result in the lower noise in APDs having the organic dielectric layer adjacent to the silicon body include improved adherence between the organic material (polyimide, for example) and the silicon (as opposed to the adherence of the silicon to the inorganic moisture barrier, such as silicon nitride); smaller trap states at the silicon surface for the organic dielectric in contact with the silicon of APD body 120 as opposed to the silicon nitride in contact with the silicon of the APD body; and curing the organic material at a high temperature before the application of the inorganic moisture barrier obviates the need to expose the inorganic material to high temperatures that tend to cause cracks or structural degradation of the inorganic material. Both embodiments, however, typically provide acceptable array performance and a high integrity moisture barrier.

Fabrication of APD array 75 as described above typically comprises steps of diffusing a p type dopant (e.g., gallium) into a wafer of crystalline silicon exhibiting n type conductivity, such as neutron transmutation doped silicon; forming an n+ doped region on the n doped region outer edge, such as by phosphorous diffusion from a spin-on phosphorous doped glass; forming a p+ region on the p doped region outer edge, such as by boron and/or gallium diffusion or ion implantation; forming the bottom contact layer, such as by sputtering on a layer of indium tin oxide; forming the respective APD bodies in the array, such as by dicing the silicon block to form deep mechanical grooves and etching the grooves to form the desired beveled sidewalls with an arcuate-shaped terminus in the vicinity of the p-n junction; applying the passivation coating; and forming the respective top contacts to respective ones of the APD bodies.

In operation, incident radiation 50 enters APD body 120 after passing through optically transparent bottom contact pad 110. The absorption of optical photons in the silicon in APD body 120 results in the generation of charge, which is multiplied and collected at top contact 140 or bottom contact pad 110. The dual layer passivation layer, in accordance with this invention, minimizes charge injection from the beveled sidewalls and other peripheral surfaces of the APD, thereby reducing noise. The inorganic moisture barrier limits moisture penetration to those sidewalls as compared with a polyimide-only passivation layer. As the moisture barrier is relatively thin, it is not as susceptible to cracks, pinholes, and stress as would exist in an inorganic dielectric-only passivation layer of equivalent total thickness (e.g., about 1 micron or more). The dual layer passivation layer further protects the silicon APD body from leakage resulting from exposure to moisture, while still enabling the use of polyimide to take advantage of its numerous attributes, such as the ability to deposit it in a relative thick amount without resulting cracks and stresses.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An avalanche photodiode (APD) comprising:
   an APD body comprising a photosensitive semiconductive material, a portion of said semiconductive material being doped to exhibit n type conductivity so as to form a first semiconductive layer, a further portion of said semiconductive material being doped to exhibit p type conductivity so as to form a second semiconductive layer, said first and second semiconductive layer being disposed adjacent to one another so as to form a p-n junction, said APD body further having top and bottom surfaces disposed opposite one another and beveled sidewalls extending from said top surface and terminating at an arcuate shaped portion in the vicinity of said p-n junction;
   a bottom contact pad disposed in electrical contact with one surface of said APD body;
   a top contact having a selected contact area disposed in electrical contact with an opposite surface of said APD body; and
   a passivation layer disposed over said APD body so as to cover said sidewalls and top surfaces of said APD body except at said selected contact area, said passivation layer comprising:
   an organic dielectric layer; and
   an inorganic moisture barrier layer.

2. The APD of claim 1 wherein said organic dielectric layer is disposed between said inorganic moisture barrier layer and said APD body.

3. The APD of claim 2 wherein said photosensitive semiconductive material comprises crystalline silicon.

4. The APD of claim 3 wherein said inorganic moisture barrier layer comprises silicon nitride.

5. The APD of claim 4 wherein said organic dielectric layer comprises a material selected from the group consisting of polyimides and benzocyclobutenes.

6. The APD of claim 5 wherein said passivation layer is adapted to retain its structural integrity and dielectric properties at voltages between said bottom contact pad and said top contact of about 1000 volts to 1500 volts.

7. The APD of claim 5 wherein said top contact is disposed in electrical contact with said first semiconductive layer and said bottom contact pad is disposed in electrical contact with said second semiconductive layer.

8. The photosensitive element of claim 5 wherein the thickness of said inorganic moisture barrier layer is between about 400 Å and 1 micron.

9. The APD of claim 5 wherein the thickness of said organic dielectric layer is between about 2 microns to 10 microns.

10. The APD of claim 9 wherein said APD is disposed in an array of APDs each having substantially the same structure, said passivation layer extending continuously between adjoining ones of said APDs.

11. The APD of claim 1 wherein said inorganic dielectric layer is disposed between said organic dielectric layer and said APD body.

12. The APD of claim 11 wherein said inorganic moisture barrier layer comprises silicon rich silicon nitride ($SiN_x$), wherein x is less than 1.33.

* * * * *